United States Patent
Lu et al.

(10) Patent No.: US 6,557,144 B1
(45) Date of Patent: Apr. 29, 2003

(54) NETLIST RESYNTHESIS PROGRAM BASED ON PHYSICAL DELAY CALCULATION

(75) Inventors: Aiguo Lu, Cupertino, CA (US); Ivan Pavisic, San Jose, CA (US); Pedja Raspopovic, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 223 days.

(21) Appl. No.: 09/737,239

(22) Filed: Dec. 14, 2000

(51) Int. Cl.[7] .............................. G06F 17/50; G06F 9/45
(52) U.S. Cl. ..................... 716/2; 716/4; 716/9; 716/10; 716/18
(58) Field of Search .............................. 716/2, 4, 9, 10, 716/18

(56) References Cited

U.S. PATENT DOCUMENTS

| | | | |
|---|---|---|---|
| 5,526,514 A | 6/1996 | Pradhan et al. | 395/500 |
| 5,875,117 A | 2/1999 | Jones et al. | 364/491 |
| 5,917,728 A | 6/1999 | Ueda | 364/490 |
| 5,999,715 A | 12/1999 | Sato | 395/500.06 |
| 6,009,248 A | 12/1999 | Sato et al. | 395/500.03 |
| 6,030,110 A | 2/2000 | Scepanovic et al. | 364/490 |
| 6,038,385 A | 3/2000 | Scepanovic et al. | 395/505.08 |
| 6,068,662 A | 5/2000 | Scepanovic et al. | 716/2 |
| 6,075,933 A | 6/2000 | Pavisic et al. | 395/500.1 |
| 6,085,032 A | 7/2000 | Scepanovic et al. | 395/500.11 |
| 6,405,345 B1 * | 6/2002 | Ginetti | 716/2 |

OTHER PUBLICATIONS

M. Pedram et al. Layout Driven Technology Mapping, 28th ACM/IEE Design Automation Conference, pp. 99–105, Jun. 1991.*
A. Lu et al., Technology Mapping for Simultaneous Gate and Interconnect Optimisation, IEEE Proceedings of Computers and Digital Techniques, pp. 21–31, Jan. 1999.*
E. Sentovich et al., Sequential Circuit Design Using Synthesis and Optimization, VLSI Design: VLSI in Computers and Processors, pp. 328–333, Oct. 1992.*

"Combining Technology Mapping with Post–Placement Resynthesis for Performance Optimization" by A. Lu et al., *IEEE*, pp. 616–621, (1998).
"Computing the Area Versus Delay Trade–Off Curves in Technology Mapping" by K. Chaudhary et al., *IEEE*, pp. 1480–1489, (1995).
"Delay Estimation and Optimization of Logic Circuits: A Survey" by M. Fujita et al., *IEEE* pp. 25–30, (1997).
"Multi–Level Logic Optimization by Implication Analysis" by W. Kunz et al., *ACM*, pp. 6–13, (1994).
"Post–Layout Logic Restructuring for Performance Optimization" by Y. Jiang et al., *ACM*, pp. 662–665, (1997).
"Post–Layout Optimization for Deep Submicro Design" by K. Sato et al., *ACM*, pp. 740–745, (1996).
"Technology Mapping of LUT based FPGAs for Delay Optimisation" by X. Lin et al, *FPL*, pp. 245–254 (1997).
"Timing Driven Placement in Interaction with Netlist Transformations" by G. Stenz et al., *ISPD*, pp. 36–41, (Apr. 1997).

* cited by examiner

Primary Examiner—Matthew Smith
Assistant Examiner—A. M. Thompson
(74) Attorney, Agent, or Firm—Westman, Champlin & Kelly

(57) ABSTRACT

A computer program that improves a netlist of logic nodes and physical placement for an IC. The program (a) identifies critical nodes based on delay information calculated from the physical placement. Then the program (b) selects a set of critical nodes and optimally collapses their critical fan-ins and part of the non-critical fan-ins based on their Boolean relationship, which, includes at least one critical node. After that, the program (c) remaps the collapsed sub-netlist by covering its subject graph with an optimal pattern graph, and dynamically estimates and updates the fanout loads. The program returns to step (b) if the remapped sub-netlist is unacceptable, and returns to step (a) after updating the delay information and coordinates of newly mapped gates if the remapped sub-netlist is acceptable. The program exits at step (a) when no more critical nodes are identified at step (a).

7 Claims, 7 Drawing Sheets

NETLIST RESYNTHESIS PROGRAM BASED ON PHYSICAL DELAY CALCULATION

CROSS REFERENCE TO RELATED APPLICATION

Reference is made to a co-pending application, serial number 09/736,571, filed on even date herewith titled "NETLIST RESYTHESIS PROGRAM USING STRUCTURE DEPENDENT CO-FACTORING" and identified as Docket Number L13.12-0115.

FIELD OF THE INVENTION

The present invention relates to the design of integrated circuits (ICs) using computer-aided design and computer-aided engineering programs (CAD/CAE). In particular, the present invention relates to CAD/CAE programs that optimize the design of an IC.

BACKGROUND OF THE INVENTION.

The design process for an integrated circuit (IC) is a process of transforming a specification for desired logic or analog functions to a physical or geometric arrangement for an IC die that can -perform the desired functions. Modern integrated circuits, particularly VLSI circuits, are very complex and various stages in the design process are automated using CAD/CAE software tools.

Typically, a technology mapping program will be used to convert a specification into an arrangement of library elements, such as gates, and interconnections. The output of the technology mapping process is a trial netlist which lists the library elements used and their interconnections, also called nodes. The technology mapping process is iterative and several trial netlists may be tried before an accepted netlist is found that has acceptable delays for each node based on a simplified delay calculation performed as part of the technology mapping. This simplified delay calculation, however, does not take into account the physical placement of the elements or interconnections.

Next, a physical placement program is used to specify geometric locations for each library element and also a geometric path for each interconnect. After a trial physical placement is made, a more complex delay calculation is made that takes into account the physical placement of the library elements and the interconnections. As the more complex delay calculation identifies critical nodes with excessive delays, the physical placement is iteratively repeated to reduce the delay to an acceptable amount. In some cases, the delay does not converge to an acceptable delay, and development activity returns to the technology mapping program to generate another accepted netlist to be tried by the physical placement program.

At the end of the process, an accepted netlist and global placement are created that may satisfy the delay requirements, however, because of the limitations of the simple delay calculations made in the technology mapping program, the netlist and global placement may not be optimized well for implementation as an IC.

A program is needed that will optimize the netlist and the global placement without, the limitations imposed by the simple delay calculations in the technology mapping used to generate the netlist.

SUMMARY OF THE INVENTION

Disclosed is a computer program that improves a netlist of logic nodes and physical placement for an IC. The program (a) identifies critical nodes based on delay information calculated from the physical placement. Then the program (b) selects a set of critical nodes and optimally collapses their critical fan-ins and part of the non-critical fan-ins based on their Boolean relationship, which includes at least one critical node. After that, the program (c) remaps the collapsed sub-netlist by covering its subject graph with an optimal pattern graph, and by dynamically estimating and updating the fanout loads. The program returns to step (b) if the remapped sub-netlist is unacceptable, and returns to step (a) after updating the delay information and coordinates of newly mapped gates if the remapped sub-netlist is acceptable. The program exits at step (a) when no more critical nodes are identified at step (a)

BRIEF DESCRIPTION OF THE DRAWINGS

FIG. 3 illustrates circuitry represented by a sub-netlist before optimization friendly collapsing of a critical fan-in;

DETAILED DESCRIPTION OF THE ILLUSTRATED EMBODIMENTS

In the present invention, a CAD/CAE optimization program is provided that operates on a netlist and global placement provided by a CAD/CAE design program to generate a final physical placement that is optimized for timing delays. In the optimization, program, a timing delay that is calculated as a function of physical placement is used to remap a sub-netlist. The problems with using a simple timing delay calculation that does take into account physical placement is avoided, and the sub-netlist is optimized. The program can be operated at more than one hierarchical level in the netlist to achieve improved results.

Figure 1:
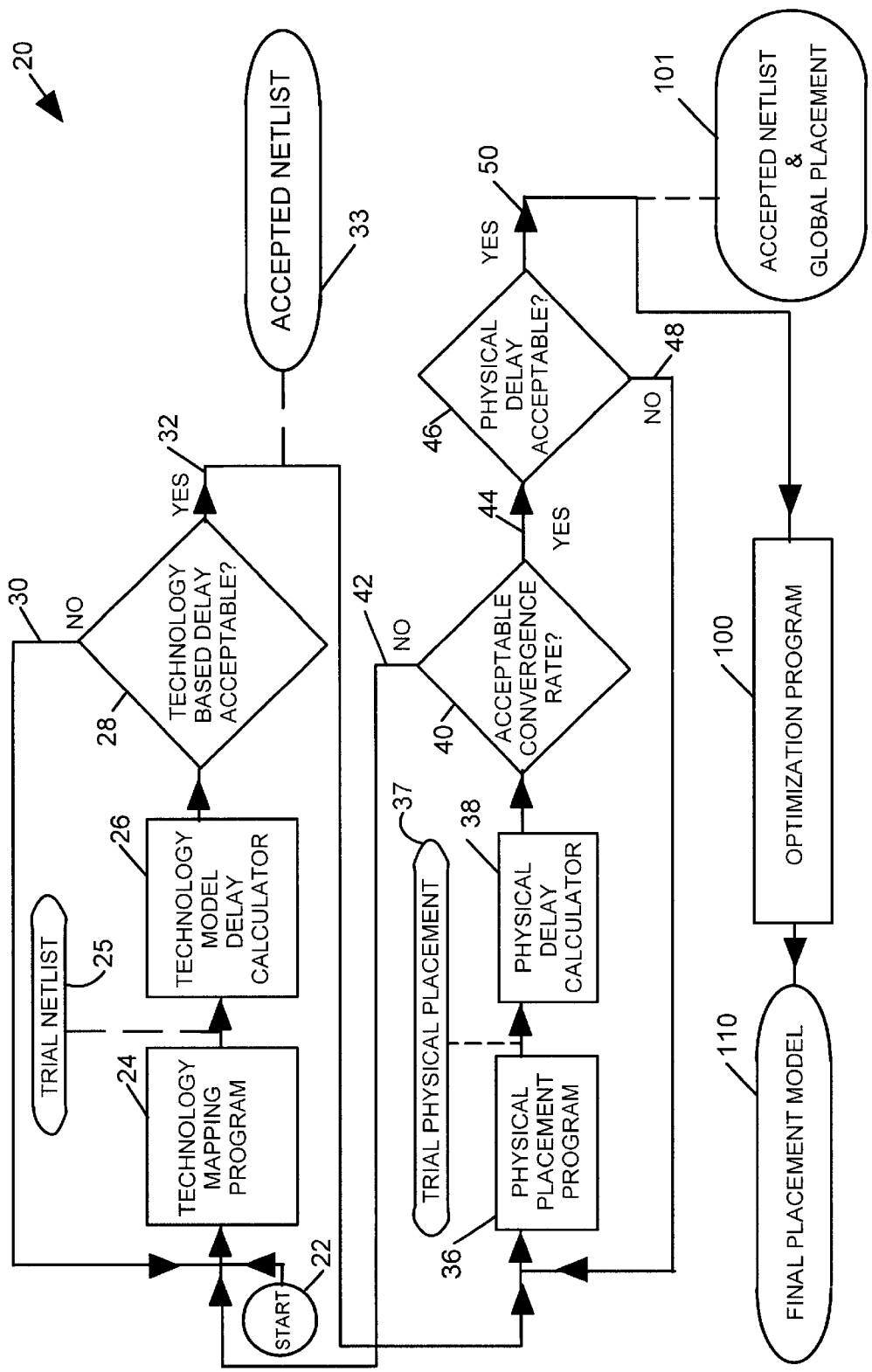
FIG. 1 illustrates a simplified flow chart of generating a global placement and subsequent optimization of an IC design.

FIG. 1 illustrates a generalized flow chart 20 of a design process of generation of an accepted netlist and global placement 101 for an IC design, and also an optimization program 100 for the IC design that generates a final placement 110 that is optimized. The final placement 110 is an optimized physical or geometric arrangement for an IC die that can perform the desired functions.

The processes illustrated in FIG. 1 are typically performed using a conventional digital computer that includes a central processor unit (CPU), read-only memory (ROM), random-access memory (RAM) and various input/output output devices. The trial netlist 25, the accepted netlist 33, the accepted netlist and global placement 101 and the final placement model 110 are typically arranged as one or more computer files that can be stored or transferred on computer readable media such as CD-ROM's, a hard disk or other magnetic media. The final placement model 110 is typically used to generate patterned masks used to manufacture semiconductor wafers embodying the IC design. The semiconductor wafers are then diced into individual integrated circuit dies that embody the IC design. The program for network resynthesis 100, or the entire program 20, can be stored as a set of instructions on computer-readable media that are executed by the digital computer.

The design process for an integrated circuit (IC) starts with a specification for some desired logic or analog functions at start 22 in FIG. 1. This specification can take the form of a list of Boolean formulas and may also include synchronization or timing requirements. The specification can be entered from a keyboard or it can be entered as a file or group of files stored on computer-readable media. A technology mapping program 24 converts the specification into a trial netlist 25, in other words, a list of library elements, such as gates, and a list of the interconnections between the elements. The output of the technology mapping program 24 is the trial netlist 25 which lists the library elements used and their interconnections, also called nodes. The technology mapping program 24 is performed iteratively and several trial netlists 25 may be tried before one is found that has acceptable delays for each node based on a simplified delay calculation performed in delay calculator 26 as part of the technology mapping. Delay calculator 26 can calculate delays based on the number and types of elements that are interconnected at each node specified in the current trial netlist 25, but it is not capable of adequately taking into account the physical size and placement of the interconnections. Delays calculated in delay calculator 26 are tested at decision point 28 to determine if all delays at all nodes are acceptable. If one or more delays are found to be not acceptable, program flow returns along line 30 to generate another trial netlist 25 at technology mapping program 24. Once the delays for all of the nodes in a trial netlist are found to be acceptable at decision point 28, then program flow continues along line 32 with an accepted netlist 33 to a physical placement program 36. Physical placement program 36 generates a trial physical placement 37 for the elements and interconnection nodes of the IC. The physical placement program 36 is used to specify geometric locations for each library element and also a geometric path for each interconnect. Each interconnect or node connects to an output of an element and fans out to connect to one or more inputs of other elements of the IC. Next, a more accurate delay calculator 38 calculates delays for all of the nodes. The delay calculator 38 takes into account the complex physical placement of the library elements and the interconnections and how they affect capacitive loading and other sources of delay. The more complex delay calculations made in delay calculator 38 identify critical nodes with excessive delays. The physical placement program 36 is iteratively repeated to reduce the delays to an acceptable amount. If delay calculator 38 identifies critical nodes at which delay is unacceptable, then the rate of iterative convergence of the delay is tested at decision point 40. If the delay is not converging, or if the delay is converging too slowly, the program flow goes back at 42 to complete another iteration of technology mapping starting at technology mapping program 24.

If the delay is converging at an acceptable rate at decision point 40, then the program flow continues along line 44 to decision point 46. The physical delays calculated at delay calculator 38 are tested at decision point 46 to see if all of the delays are acceptable. If one or more of the delays are found not acceptable at decision point 46, then program flow goes back along line 48 to try another iteration of physical placement at 36. Once all of the delays are acceptable, then program flow continues from decision point 46 along line 50 to optimization program 100. This provides optimization program 100 with an accepted netlist and global placement 101.

The accepted netlist and global placement 101 satisfies the delay requirements, however, because of the limitations of the simple delay calculations made in the technology model delay calculator 26, the accepted netlist and global placement 101 may not be optimized well for implementation as an IC.

A program is needed that will further optimize the accepted netlist and the global placement 101 without the limitations imposed by the simple delay calculations in the technology model delay calculator 26. Optimization program 100 of FIG. 1 performs the further optimization that is needed, as explained below in connection with examples illustrated in FIGS. 2–7.

The optimization program 100 performs timing driven technology re-mapping in a placement program using optimizations-friendly collapsing of critical nodes and dynamically estimating the fanout loads. An important advantage that can be achieved with optimization program 100 is better estimation of interconnect delays in the re-mapping process and a more powerful re-mapping algorithm.

In the hierarchical design of a very large scale integrated (VLSI) circuit, technology mapping program 24 has the freedom to change the netlist structure, but it does not; have access to the physical interconnect information. On the other hand, the physical placement program 36 has more detailed interconnect information, but it has limited capability to change the netlist structure. Unlike they current methodology which relies on iterations along line 42 between a technology mapping, program and a placement program to achieve timing closure (eg., as described in "Timing Driven Placement in Iterations with Netlist Transformation," Guenter Stent et al., pages 36–41, ISPD—97, April 1997), optimization program 100 provides a program in which technology mapping and a physical delay calculator interact with one another directly to provide a more optimum result.

In optimization program 100, whether the re-mapped sub-netlist is acceptable or not is determined based on the same type of delay calculator as that used in a physical placement program. This is, of course, much more accurate than the delay calculation (whether it is based on the wire load delay model or the back-annotated custom wire load delay model) used in technology mapping programs (e.g., as described in "Combining Technology Mapping with Post-Placement Resynthesis for Performance Optimization," Aiguo Lu et al., pages 616–621, ICCD'98, October 1998) which estimates the interconnect delay based on the fanout count of the subject graph. This important factor is changing dynamically during the re-mapping process.

As explained below in connection with FIGS. 6, 7, the optimization program 100 can predict and update those dynamic changes based on a calculation of reconvergent paths. In this way, optimization program 100 can more accurately estimate the interconnect delay inside the remapping process. In addition, with the proposed collapsing method, optimization program 100 is able to further optimize the sub-netlist being re-mapped.

Figure 2:
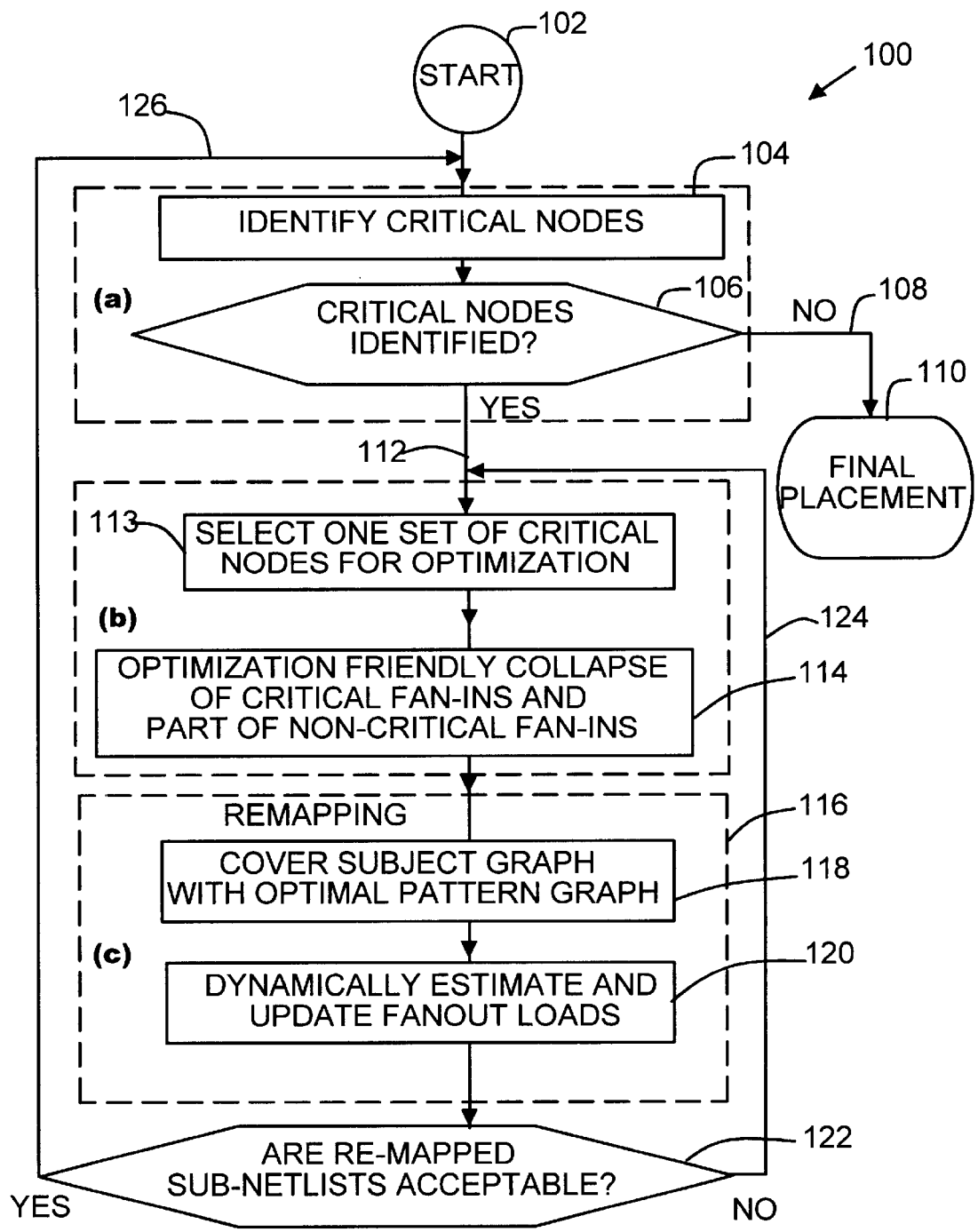
FIG. 2 illustrates a simplified flow chart of an optimization program for an IC design using remap placement.

FIG. 2 shows a simplified flowchart of an example of an optimization program 100 that uses an in-placement timing driven re-mapping process. Starting at 102 from calculated delay information after global placement 101, critical nodes are identified based on physical placement at step 104. If there are no critical nodes identified, then no more sub-netlist is left for re-mapping at decision point 106, in other words the re-mapping process is complete, and the program proceeds along line 108 to provide a final placement 110. If there are one or more critical nodes identified at decision point 106, The re-mapping process starts at line 112 and comprises several steps:

(1) a set of critical nodes is selected for optimization of the selected sub-netlist at process step 113;
(2) collapsing the critical fan-ins to the critical nodes on the selected sub-netlist at step 114. This collapsing is done in a way that is friendly to logic optimization and includes collapsing of part of non-critical fan-ins as well;
(3) as part of a remapping process 116, a subject graph of the sub-netlist is built.and covered with a subject graph at process 118;
(4) as part of the remapping process 116,.fanout loads are dynamically estimated and updated based on physical delay calculations at process 120.

In a preferred embodiment, the logic resynthesis or remapping process 116 includes delay-oriented co-factoring for the collapsed nodes, and then optimizing each node in the sub-netlist.

After the sub-netlist is re-mapped, the program checks whether the result is acceptable or not at decision point 122. If acceptable, the re-mapped sub-netlist with estimated coordinates is then merged into the netlist, the in-placement delays are updated, and program flow proceeds along line 126 to step 104 to repeat the process. If not acceptable, program flow proceeds along line 124 to select another set of critical nodes for re-mapping at step 113. An advantage of this exemplary re-mapping algorithm in steps (1) and (4) above is optimization-friendly collapsing and covering with dynamic fanout load prediction and update.

Optimization-friendly Collapsing

Collapsing critical fan-ins of the selected critical nodes includes creating new Boolean functions for those nodes so that they can be more delay optimally re-mapped.

Figure 3:
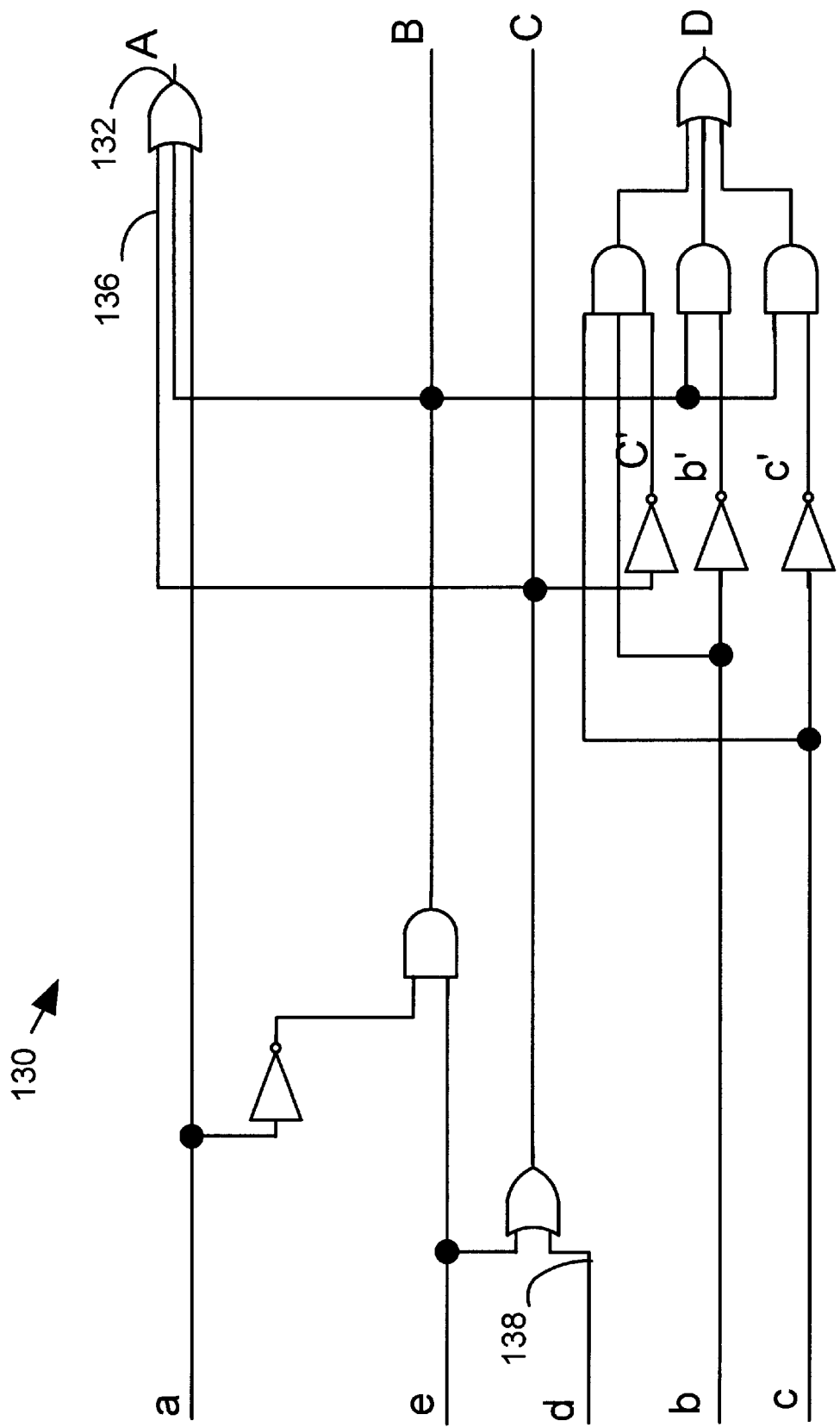

In FIG. 3, for example, circuitry 130 represents a selected sub-netlist with four output logic nodes A, B, C, and D, and five input logic nodes a, b, c, d, e. The Boolean sub-netlist statements for the circuitry illustrated in FIG. 3 are:

$A=a+B+C$ $B=a'e$ $C=d+e$ $D=b'B+c'B+bcC'$

Node A at 132 is identified as a critical node to be re-mapped, and the delay calculator has identified node C at 136 as the critical fanin of A, with node d at 138 being the critical fanin of C. Collapsing node C at 136 to node A at 132 gives the Boolean statement $A=a+B+d+e.$ Then, as illustrated in FIG. 4, node A is remapped as shown at 140 to give:

$A=d+E.$ $E=a+B+e,$

Figure 4:
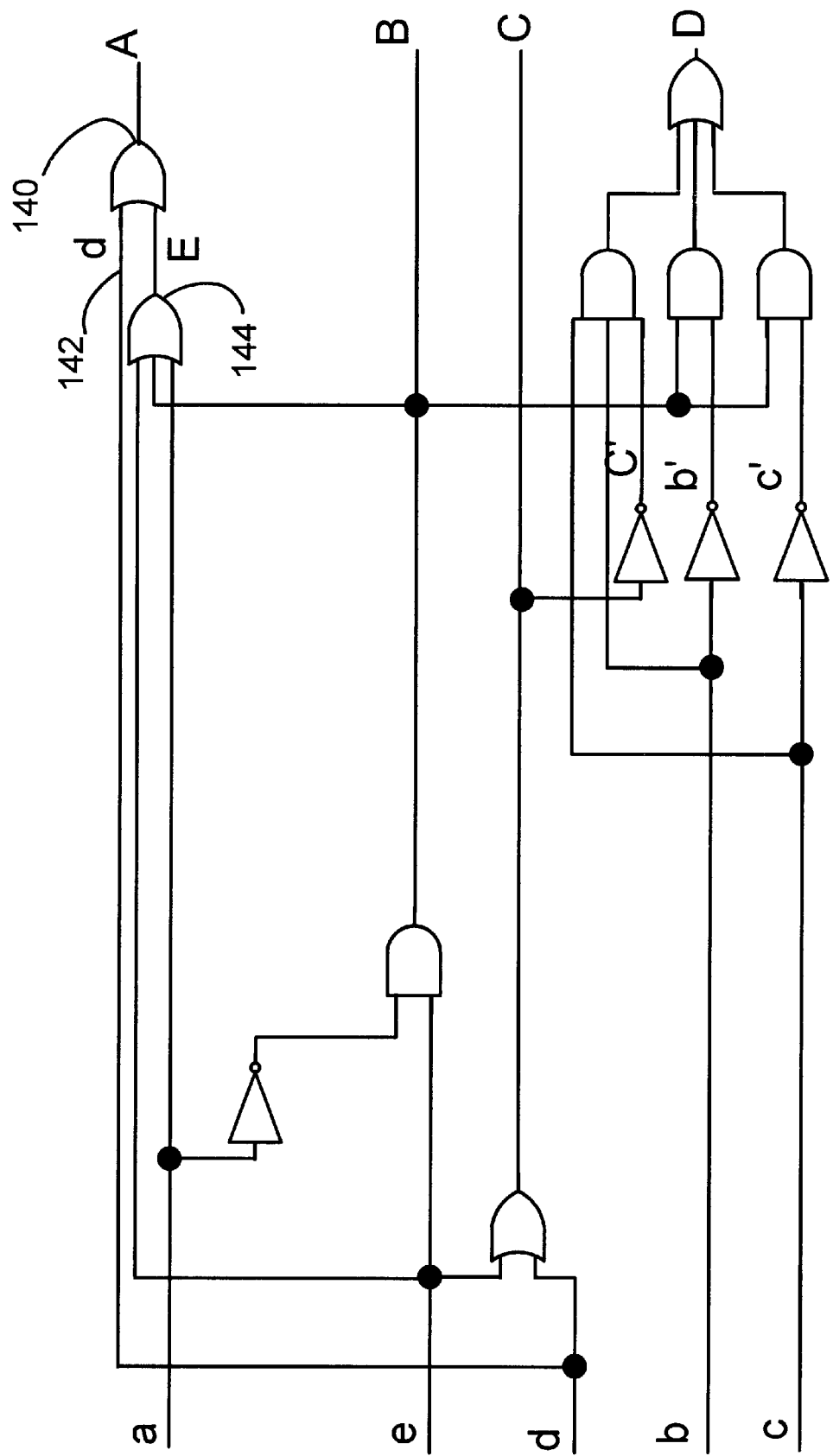
FIG. 4 illustrates the circuitry of FIG. 3 after a first optimization friendly collapsing of a critical fan-in and remapping.
Figure 5:
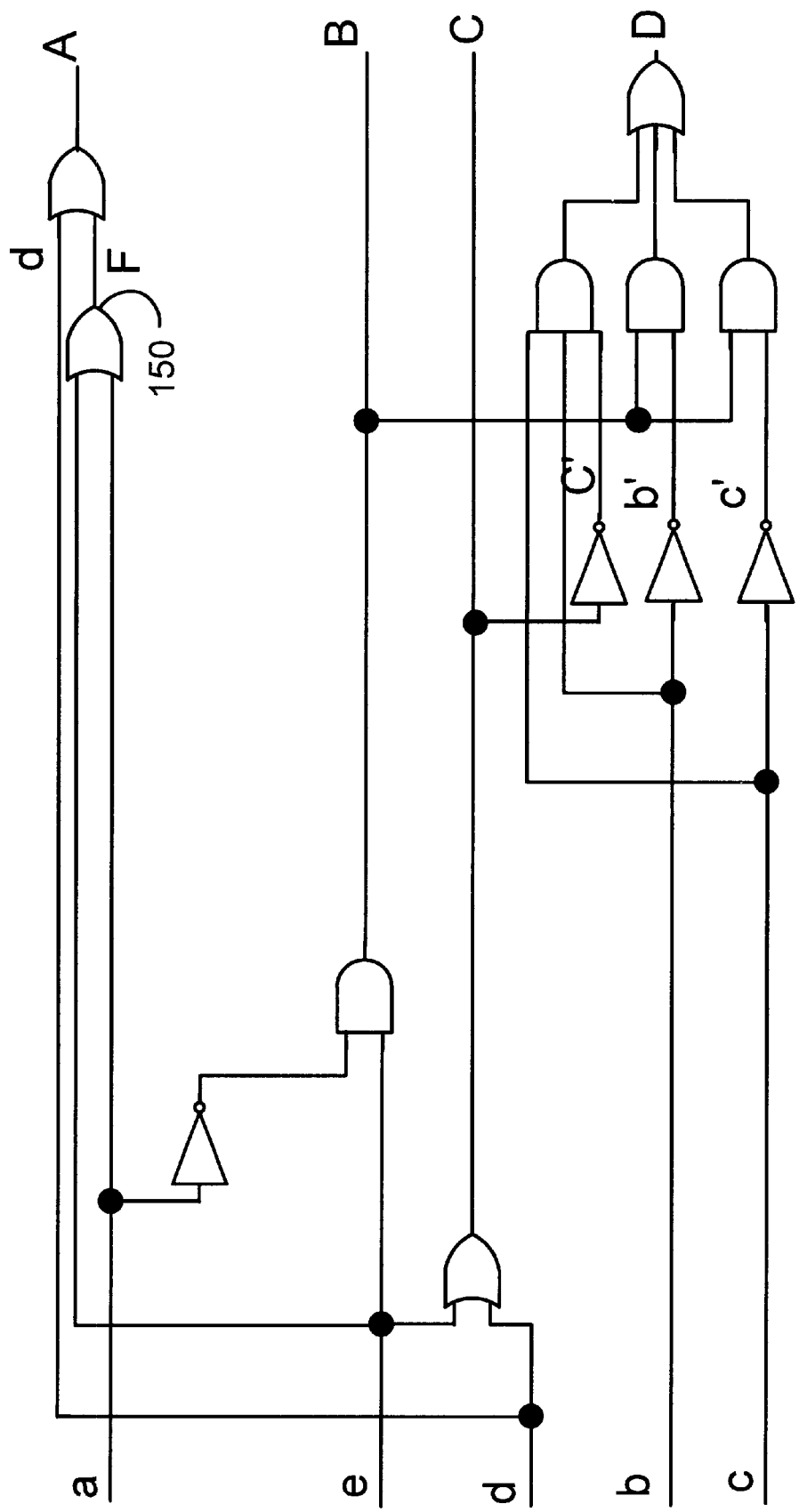
FIG. 5 illustrates the circuitry of FIG. 3 after a second optimization friendly collapsing of a critical fan-in and a non-critical fan-in and then remapping.

The remapping illustrated in FIG. 4 moves the critical input d at 142 to node A at 140. The delay of critical node A at 140 in FIG. 4 is reduced in comparison to the delay of node A at 132 in FIG. 3. Node E at 144 in FIG. 4 is a 3-input OR-gate.

Referring back to FIG. 1, if the multi-level logic optimization and technology mapping illustrated in FIGS. 3–4 were performed in the higher level of the design flow (blocks 24, 26, 28 of FIG. 1, i.e., before. physical placement) the program would not have the accurate interconnect information, and the program would have to estimate interconnect delays based on their available netlist delay models. So the mapped netlist 33 would reproduced based on those netlist estimation models and would not be optimal with respect to the requirement of placement. What is worse, most of available technology mapping algorithms for logic optimization and technology mapping are NP-complete. Fundamentally, they cannot achieve the optimal mapping netlists even with the accurate delay models. The optimization program 100, however, can perform collapsing as illustrated in FIGS. 3, 4 using a delay calculator that is based on a physical model.

The collapsing illustrated in FIG. 4 can be further optimized by another iteration of the optimization program 100. With any given critical node N, a set of critical fan-ins CF of N can be identified based on the physical placement delay calculator, leaving the remaining other fan-ins to form a set of non-critical fan-ins NF of N. For each critical node n in CF, the program collapses n to N. This creates a new node, called NN. Each new node NN has a support count sup(NN). For each node n in NF, collapsing n to NN gives NN1; if sup(NN1) is less than or equal to sup(NN), n will be collapsed to NN so as to expand the optimization potentials.

Applying this optimization process to the example illustrated in FIG. 3, the program determines that B can also be collapsed to A, which gives a new Boolean function A=a+a'e+d+e. Optimizing the Boolean function for A gives A=a+d+e, and so it can be mapped to A=d+F and F=a+e. Instead of using a 3-input OR-gate for A as illustrated at 132 in FIG. 3 or using a 3 input OR-gate for E as illustrated at 144 in FIG. 4, a 2 input OR-gate as illustrated at 150 in FIG. 5 can be used for F with this improved optimization.

Covering with Dynamic Fanout Prediction and Update

Fanout count is an important factor in the remapping process 116 of FIG. 2 to estimate interconnect delays. Previous tree-based covering algorithms utilize the fanout count in the subject graph (e.g., as described in "Computing the Area vs. Delay Trade-Off Curves in Technology Mapping," Kamal Chaudhary et al., pages 1480–1489, IEEE Transactions of ICCAD, volume 14, number 12, December 1995). However, the optimization program 100 adjusts for the fact that the fanout count is dynamically changing in the covering process.

Figure 6:
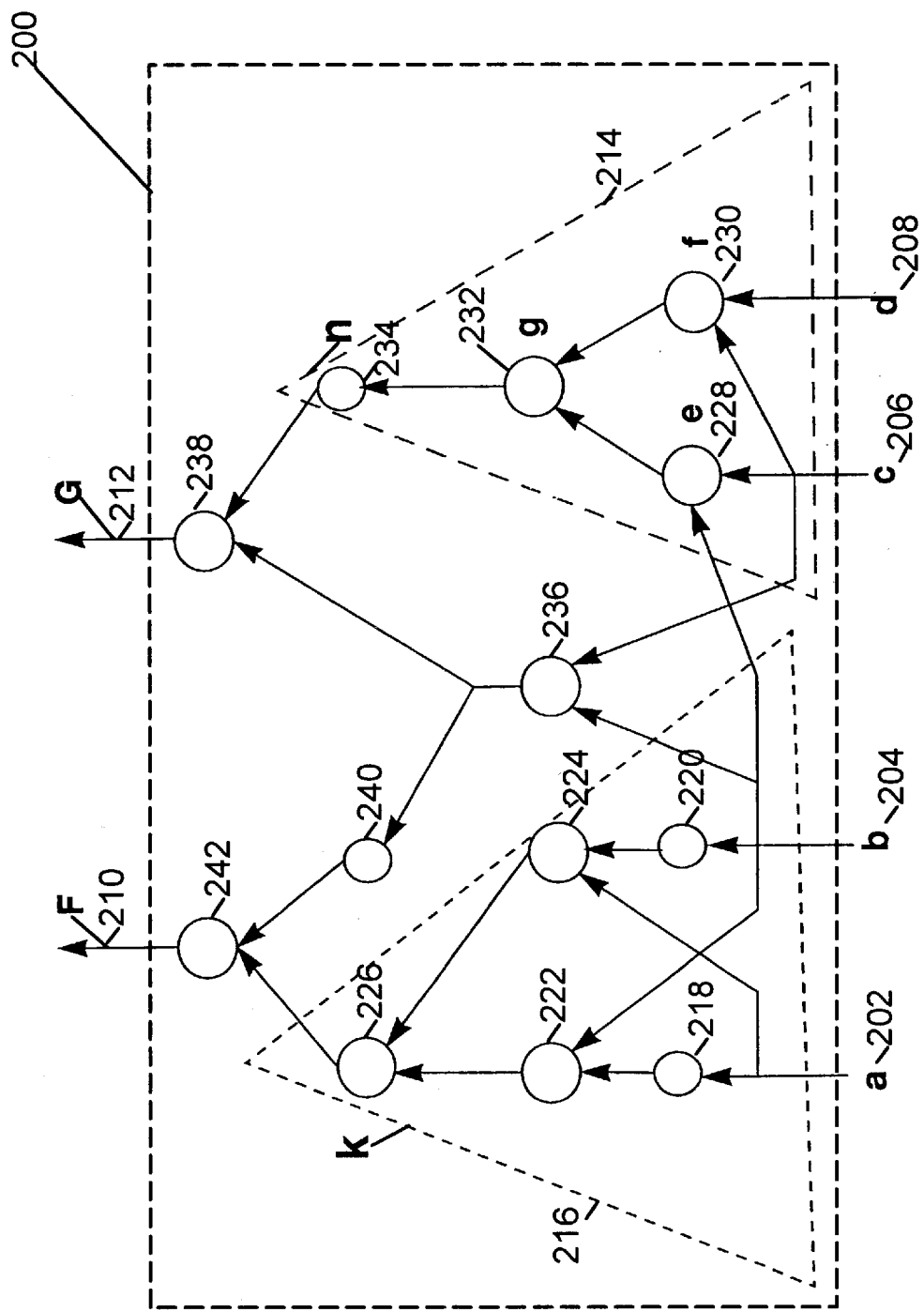
FIG. 6 illustrates a subject graph of circuitry before a covering process.
Figure 7:
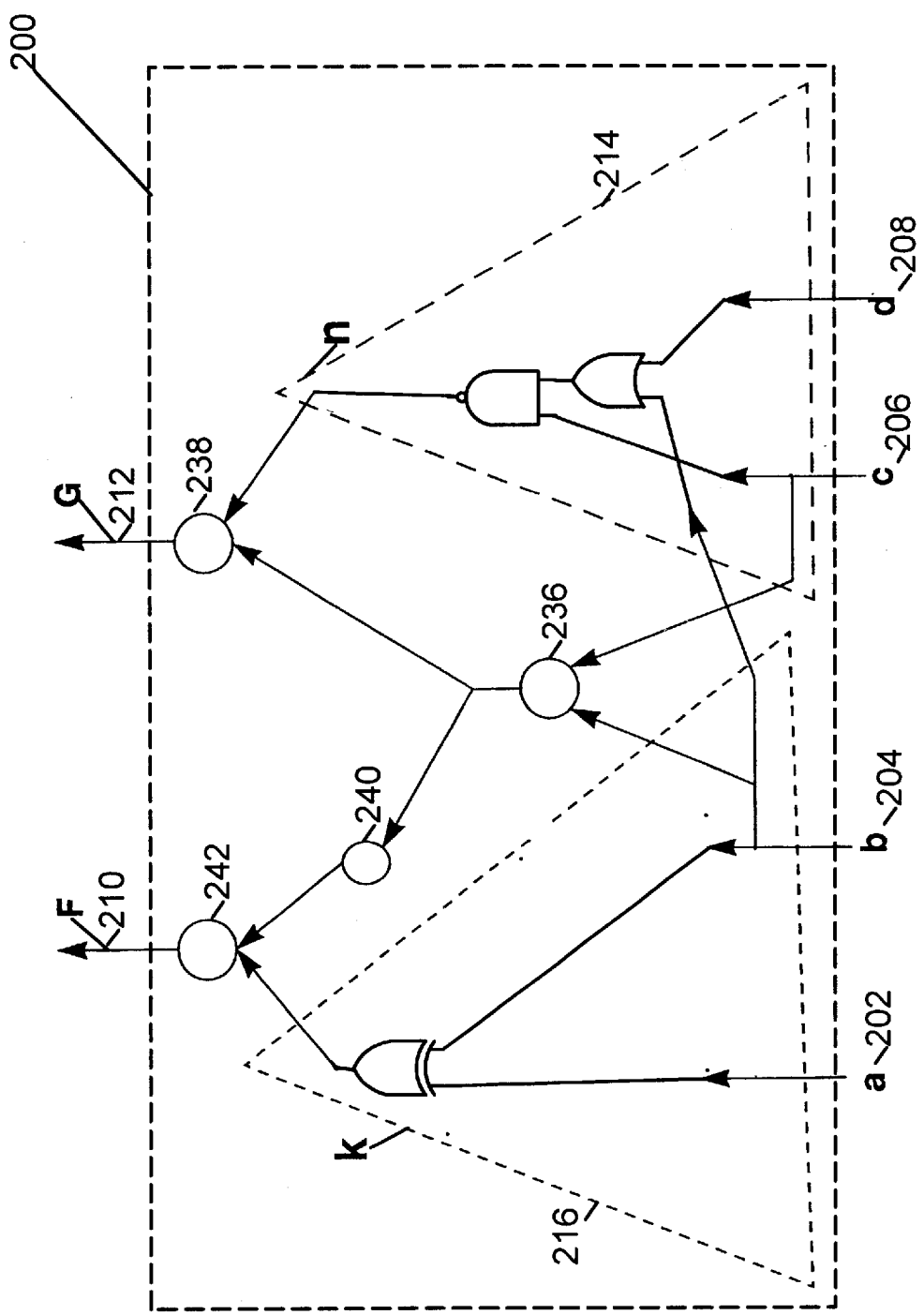
FIG. 7 illustrates the subject graph of FIG. 6 after a covering process.

FIG. 6 shows a subject graph 200 in which each two-input node 222, 224, 226, 228, 230, 232, 236, 238, 242 represents a NAND gate and each one-input node 218, 220, 234, 240 represents an inverter. The original fanout count of inputs a at 202, b at 204, c at 206 and d at 208 are 2, 4, 3 and 1, respectively, as illustrated. Because the fanout count of nodes a at 202 and b at 204 affects the estimation of arrival time at the output (e.g., node k at 216) of these two nodes and the arrival time will affect the choice of the best covering for other nodes (e.g. node n at 214), the program uses a logic cone based covering process to solve this problem. In the subject graph of FIG. 6, there are two logic cones F at 210 and G at 212. By covering the subject graph of one logic cone with the subject graph of another logic cone, the program updates the fanout count for the re-mapped logic cone. This gives a more accurate delay estimation when covering other logic cones.

However, the logic cone based covering process still has a problem when covering the current logic cone. As illustrated in FIG. 7, node k at 216 is covered with an XOR gate. Logic cone F at 210 is covered first. After that, the fanout count of nodes a at 202, b at 204, c at 206 and d at 208 are updated to 1, 3, 3, 1, respectively. Next the program covers logic cone G. If node n at 214 is covered by the dashed triangle with an OR gate and a NAND gate, as shown in FIG. 7, the fanout count of node c at 206 is changed from 3 to 2. A careful investigation of the fanout change issue shows that this change in fanout is related to reconvergent paths. Reconvergent paths are multiple paths associated with a node that start from the node and converge to another node. When there are reconvergent paths starting from a node, it is likely that the fanout count will probably change in the covering process. For node c at 206 in FIG. 6, there are a pair of reconvergent paths (c→e→g, c→f→g). To more accurately estimate the interconnect delays at those nodes with reconvergent paths, the program can include a look-forward step. If the multiple-fanout node (e.g., node c) has the reconvergent paths, the covering step moves forward to its converging node (e.g., node g is the converging node of node c in FIG. 6). In this way the program is able to determine the best coverings of node c's fanouts, thus to get the real fanout load of node c.

With the present invention, an optimization program can provide an optimized physical placement for an integrated circuit-design. Technology mapping and a physical delay calculator interact with one another directly to provide a more optimum result. This is much more accurate than the delay calculation used in technology mapping programs, that estimate interconnect delays based on fanout count. The delay is changing dynamically during a re-mapping process, and the optimization program corrects for the dynamic changes when there are reconvergent paths.

If desired, features described in this application can be combined with features described in our co-pending application, serial number 09/736,571, filed on even date herewith titled "NETLIST RESYNTHESIS PROGRAM USING STRUCTURE DEPENDENT CO-FACTORING" and identified as Docket Number L13.12-0115.

Although the present invention has been described with reference to preferred embodiments, workers skilled in the art will recognize that changes may be made in form and detail without departing from the spirit and scope of the invention.

What is claimed is:

1. A method for automatically improving an accepted netlist and global placement of logic nodes and physical placement for an integrated circuit (IC), comprising:

A) receiving an accepted netlist and global placement from a design process for the IC design;

B) identifying critical nodes based on delay time calculated from the physical placement;

C) selecting a set of critical nodes comprising critical fanins and non-critical fan-ins in an uncollapsed sub-netlist, and optimally collapsing the critical fan-ins to form a collapsed sub-netlist so that the collapsed sub-netlist is remapped better than before the collapsing;

D) building a subject graph and covering the subject graph with a pattern graph to remap the collapsed sub-netlist; and E) returning to C) if the collapsed sub-netlist is unacceptable, returning to B) if the collapsed sub-netlist is acceptable, and exiting at B) when no more critical nodes are identified at B).

2. The method of claim 1, further comprising:

F) storing a plurality of sequences of instructions describing A), B), C), D) and E) on a computer readable medium, the plurality of sequences of instructions including sequences which, when executed by a processor, cause the processor to generate a final placement for the IC.

3. The method of claim 2 wherein C) includes optimally collapsing the critical fan-ins and at least one of the non-critical fan-ins based on their Boolean relationship to the selected critical nodes.

4. The method of claim 2 wherein D) includes identifying reconvergent logic paths of the subject graph and a forward-mapping step to estimate the fanout loads.

5. The method of claim 2 wherein D) includes a covering process based on logic cones and dynamically estimating and updating fanout loads of the collapsed sub-netlist.

6. The method of claim 2 wherein B), C) and D) are performed at multiple levels of a hierarchical logic structure.

7. The method of claim 2 wherein technology mapping and a physical delay calculator interact with one another directly to provide an optimum interconnect delay.

* * * * *